US009231491B2

(12) United States Patent
Benson et al.

(10) Patent No.: US 9,231,491 B2
(45) Date of Patent: Jan. 5, 2016

(54) CABINET-BASED DC POWER SYSTEMS

(71) Applicant: Stored Energy Systems, a Limited Liability Company, Longmont, CO (US)

(72) Inventors: Michael A. Benson, Boulder, CO (US); Jeffrey L. Chilson, Windsor, CO (US); Jack Strandquist, Berthoud, CO (US); William F. Kaewert, Longmont, CO (US); Barry Eppler, Berthoud, CO (US)

(73) Assignee: Stored Energy Systems, Longmont, CO (US)

( * ) Notice: Subject to any disclaimer, the term of this patent is extended or adjusted under 35 U.S.C. 154(b) by 140 days.

(21) Appl. No.: 14/099,889

(22) Filed: Dec. 6, 2013

(65) Prior Publication Data
US 2014/0160686 A1    Jun. 12, 2014

Related U.S. Application Data

(60) Provisional application No. 61/734,944, filed on Dec. 7, 2012.

(51) Int. Cl.
*H05K 5/00* (2006.01)
*H02M 7/00* (2006.01)
*H05K 7/20* (2006.01)

(52) U.S. Cl.
CPC ............. *H02M 7/003* (2013.01); *H05K 7/2089* (2013.01)

(58) Field of Classification Search
USPC .................. 361/727–731, 756, 800; 417/321; 700/101–103, 107
See application file for complete search history.

(56) References Cited

U.S. PATENT DOCUMENTS

| | | | | | |
|---|---|---|---|---|---|
| 5,712,779 | A | * | 1/1998 | Sheppard et al. | 363/69 |
| 7,608,937 | B1 | * | 10/2009 | Altenschulte | 290/44 |
| 8,325,479 | B2 | * | 12/2012 | Siracki et al. | 361/679.5 |
| 8,908,356 | B2 | * | 12/2014 | Wang | 361/642 |
| 8,952,252 | B2 | * | 2/2015 | Bugaris et al. | 174/50 |

OTHER PUBLICATIONS

"Te45v3 Power" by Alpha Technologies, Alpha Technologies Catalog, 2012, p. 144, 1 pp.

* cited by examiner

*Primary Examiner* — Hung S Bui
(74) *Attorney, Agent, or Firm* — James A. Sheridan; Sheridan Law, LLC (57) ABSTRACT

In an embodiment, a compact factory assembled and tested cabinet-based Direct Current (DC) power system includes at least one Alternating Current (AC) to DC converter disposed in a cabinet as at least one interchangeable module. An AC input section is also disposed in the cabinet and supplies AC power to the converter(s). At least one other electrical component is disposed in the cabinet, possibly as a module and it receives DC power from the converter(s). Other embodiments are also disclosed.

18 Claims, 8 Drawing Sheets

120VDC System, 100Amps DC, 7 rectifiers @ 14.3 Amps each
24VDC System, 300Apms DC, 5 recifiers @ 60 Amps each
24VDC System (F&G), 80Amps DC, 2 rectifiers @ 40 Amps each

| Component Description | Qty |
|---|---|
| AC Input and Distribution Components | |
| AC distribution panel | 1 |
| Surge protection device | 1 |
| NEMA 15-50R 250VAC receptacle | 3 |
| ground lug | 1 |
| 3-position terminal block | 4 |
| TB jumpers, large | 6 |
| Main AC input breaker, 3-pole 50Amp | 1 |
| Hardware | 1 |
| Step-down transformer | |
| 3-phase transformer, 30KVA | 1 |
| xfmr mounting bracket | 2 |
| hardware | 1 |
| PowerCage, System#1, 125V 100A | |
| Bus bar assembly | 1 |
| Chassis | 1 |
| FP2 system, rack mount, 2U, 4 rect positions | 1 |
| Rectifier shelf 1U (incl, mtng bracket, install kit) | 1 |
| Rectifier module, 125V, 2000W | 7 |
| terminal block, 3-position | 1 |
| terminal block, 12-position | 1 |
| AC cord bushing | 1 |
| AC cord with NEMA 15-50P 250VAC plug | 1 |
| bracket for AC cord entry | 1 |
| bracket for fuses | 3 |
| fuse, 30Amp | 5 |
| fuseblock, dual | 3 |
| Internal wiring | 1 |
| hardware | 1 |
| PowerCage, System#2, 24V 300A | |
| Bus bar assembly | 1 |
| Chassis | 1 |

FIG. 5A

| | |
|---|---|
| FP2 system, rack mount, 2U, 4 rect positions | 1 |
| Rectifier shelf 1U (incl, mtng bracket, install kit) | 1 |
| Rectifier module, 125V, 2000W | 5 |
| terminal block, 3-position | 1 |
| terminal block, 12-position | 1 |
| AC cord bushing | 1 |
| AC cord with NEMA 15-50P 250VAC plug | 1 |
| bracket for AC cord entry | 1 |
| bracket for fuses | 3 |
| fuse, 30Amp | 5 |
| fuseblock, dual | 3 |
| Internal wiring | 1 |
| hardware | 1 |

PowerCage, System#3, 24V 80A

| | |
|---|---|
| Bus bar assembly | 1 |
| Chassis | 1 |
| FP2 system, rack mount, 2U, 4 rect positions | 1 |
| Rectifier shelf 1U (incl, mtng bracket, install kit) | 1 |
| Rectifier module, 125V, 2000W | 2 |
| terminal block, 3-position | 1 |
| terminal block, 12-position | 1 |
| AC cord bushing | 1 |
| AC cord with NEMA 15-50P 250VAC plug | 1 |
| bracket for AC cord entry | 1 |
| bracket for fuses | 3 |
| fuse, 30Amp | 3 |
| fuseblock, dual | 3 |
| Internal wiring | 1 |
| hardware | 1 |

PowerCage, System#3, 24V 80A

| | |
|---|---|
| 20HP motor starter | 1 |
| mounting brackets, side | 2 |
| mounting brackets, chassis extension | 2 |
| nut plate | 2 |
| rack mount brackets | 2 |
| hardware | 1 |

Cabinet & Additional components

| | |
|---|---|
| Steel cabinet, 29 x 36 in, 79 in high | 1 |
| set of 11 engraved nameplates, white-on-black | 1 |

CABINET-BASED DC POWER SYSTEMS

REFERENCE TO PENDING PRIOR PATENT APPLICATION

This application claims the benefit under 35 U.S.C. 119 (e) of U.S. Provisional Patent Application No. 61/734,944, filed Dec. 7, 2012 by Michael A. Benson, Jeffrey L. Chilson, Jack Strandquist, William F. Kaewert, and Barry Eppler for "TURBINE CONTROL POWER SYSTEM" which patent application is hereby incorporated herein by reference.

BACKGROUND

Generally, cabinet-based DC power systems, with and without batteries, are commercially available from a variety of sources. An AC to DC converter, with or without a battery charger, in a steel cabinet, is also commercially available from a variety of sources. A single steel cabinet mounting more than one AC to DC converter, with or without a battery charger, is also commercially available. An AC to DC converter, with or without a battery charger, and rechargeable batteries in a steel cabinet is commercially available. A combination of multiple chargers, battery sets, or cabinets is commercially available for use in the system. Rechargeable batteries in a steel cabinet may also be used in such systems. Multiple battery shelves installed in a steel cabinet to support rechargeable batteries is another commercially available component.

Other available components or equipment may be installed in existing steel cabinets, including: circuit breakers, vertical rack mount rails that meet EIA standards, inverters (DC to AC converters), relays, voltage monitoring equipment, current shunts, personal computers, and other communications and monitoring equipment. Other parts may include hinged doors, removable panels (full or partial) located on any side or bottom or top, cooling vents, filters, fans, thermometers, mounted on or in these steel cabinet systems.

Other commercially available items include provisions for moving and lifting steel cabinets, including various types of fork lift bases, and top lift features or attachments such as brackets, bolts, or other hardware.

In many existing DC power systems, AC to DC conversion is accomplished by transformer-type Silicon-Controlled Rectifier (SCR) battery chargers that are large, heavy, and inefficient. Newer switched mode converters enable greater power density and less waste heat so as to provide increased energy efficiency. In such switched mode converters, circuitry is used to make an input current waveform as close to sinusoidal as possible and in-phase with a sinusoidal input voltage waveform. This provides reduced ("cleaner") harmonic content on the AC line and fewer volt-amps wasted (apparent power is much closer to real power). This feature may be referred to as active power factor correction.

Various DC power systems described above are commercially available. In most cases, one or more specifications, measures, or parameters fall short of the desired performance characteristics and attributes in an improved system. Examples include, but are not limited to, the need for multiple systems to perform a function or a lack of integration. For example, a function may be performed in existing systems by a combination of expensive systems, less efficient systems, systems with a lower level of reliability, systems which are more difficult to install and repair, systems that require a longer period of time to repair or to return to service. Existing DC power systems are more difficult to understand and order correctly because of a larger number of model numbers. For example, a user who needs a system that can run on 208 VAC, but who ordered a system that runs on 240 VAC, has ordered the wrong system and the user has to incur the costs of return, restocking charges, reshipment, etc. Further existing systems can not be field-upgraded to produce more DC output power.

No pre-existing cabinet-based DC power system has been qualified, tested, and marked as compliant with International Building Code (IBC) Seismic standards.

SUMMARY

This Summary is provided to introduce a selection of concepts in a simplified form that are further described below in the Detailed Description. This Summary is not intended to identify key aspects or essential aspects of the claimed subject matter. Moreover, this Summary is not intended for use as an aid in determining the scope of the claimed subject matter.

In an embodiment, there is provided a compact factory assembled and tested cabinet-based Direct Current (DC) power system that includes a plurality of Alternating Current (AC) to DC converters disposed in a cabinet as at least one interchangeable module, such as for front access. An AC input section is also disposed in the cabinet and supplies AC to the plurality of converters. At least one other electrical component is disposed in the cabinet and it receives DC from the converter(s), possibly as a module and/or with front access. Wiring disposed in the cabinet may be configured to operatively connect at least one of the plurality of converters to the electrical component(s), which may be a motor starter disposed in the cabinet, for which at least one of the converters converts AC voltage to 125 VDC. In such an embodiment, the cabinet-based DC power system may be significantly smaller than multiple power systems, a separate motor starter and related wiring. Alternatively, or additionally the electrical component(s) may be one or more batteries disposed in the cabinet, which one or more of the converters charge. Another component that may be disposed in the cabinet is a DC to AC inverter, receiving DC power from the battery and providing AC power. The other electrical component disposed in the cabinet may be at least one DC-to-DC converter, which may convert DC power from one of the plurality of converters for input into another of the converters. Embodiments of the cabinet-based DC power system may be at least a portion of a turbine control system.

Thus, in another embodiment, there is provided a compact factory assembled and tested cabinet-based turbine control power system includes at least one AC to DC converter disposed in a cabinet as at least one front access interchangeable module, an AC input section, disposed in the cabinet and supplying AC to the converter(s), and a reduced voltage motor starter disposed in the cabinet as a front access interchangeable module that receives DC power from the converter(s). Again, wiring disposed in the cabinet may be configured to operatively connect the converter(s) to the reduced voltage motor starter. Such a cabinet-based turbine control power system is significantly smaller than the conventional arrangement of multiple power systems, a separate motor starter and related wiring. The converter(s) may, in certain embodiments convert AC voltage to 125 volts DC for supply to the motor starter. One or more additional electrical components may be disposed in the cabinet and receive DC voltage from at least one additional converter disposed in the cabinet. This electrical component may be at least one battery disposed in the cabinet, charged by the additional converter(s). A DC to AC inverter may also be disposed in the cabinet, receiving DC from at least one battery to provide AC voltage. Another additional electrical component that may be disposed in the cabinet is a DC-to-DC converter that converts DC voltage from one converter to another DC voltage for input into another converter.

Hence, an embodiment of a method of manufacturing a compact factory assembled and tested cabinet-based DC power system may include providing one or more steel cabinets, into which an AC input section is disposed. At least one front access AC to DC converter is disposed in the cabinet as at least one interchangeable module and AC power from the AC input section is supplied to the converter(s). At least one other front access electrical component is disposed in the cabinet. This component may be selected from the group comprising a reduced voltage motor starter, a DC-to-DC converter, a DC to AC inverter, one or more batteries, or the like. DC power is supplied from the converter(s) to the electrical component(s).

Other embodiments are also disclosed.

Additional objects, advantages and novel features of the technology will be set forth in part in the description which follows, and in part will become more apparent to those skilled in the art upon examination of the following, or may be learned from practice of the technology.

BRIEF DESCRIPTION OF THE DRAWINGS

Non-limiting and non-exhaustive embodiments of the present invention, including the preferred embodiment, are described with reference to the following figures, wherein like reference numerals refer to like parts throughout the various views unless otherwise specified. Illustrative embodiments of the invention are illustrated in the drawings, in which.

DETAILED DESCRIPTION

Embodiments are described more fully below in sufficient detail to enable those skilled in the art to practice the system and method. However, embodiments may be implemented in many different forms and should not be construed as being limited to the embodiments set forth herein. The following detailed description is, therefore, not to be taken in a limiting sense.

Generally, in accordance with various embodiments the present cabinet-based DC power system comprises more than one AC to DC converter system, each of which provides rectification, filtering, regulation and distribution of AC electric power to produce DC electric power. Each converter subsystem provides DC electric power to various types of user-supplied loads, including rechargeable batteries. Therefore, each converter system functions as both a DC power supply and a battery charger.

In addition to functioning as a multiple-output AC to DC power conversion and battery charging system, embodiments of the present cabinet-based DC power system can also contain rechargeable batteries and therefore can function as a "UPS" Uninterruptible Power System with the ability to provide DC electric power for a period of time with or without AC electric power supplied to the input of the system.

Thus, embodiments of the present cabinet-based DC power system may house multiple powerful battery chargers and related equipment such as reduced voltage motor starter or DC-DC converters in a compact factory assembled and tested cabinet. This delivers significant space, time and cost saving benefits compared with field installation of multiple power systems, motor starters and related wiring.

Embodiments of the present cabinet-based DC power systems use commercially available mechanical, electrical and electronic components, including hardware and software, assembled and connected to produce the desired system functions. The AC to DC converters (also called rectifiers) may be commercially available high-frequency switched mode devices that use state-of-the-art power electronics components, topologies, and circuit implementations to accomplish power conversion and control. Modular rectifier/battery chargers offer significant relative energy efficiency. Waste heat from chargers is reduced to less than half that of older products. This significant improvement enables use of smaller, less costly control room air conditioners in a room housing the present system, extends the life of the system and reduces electricity costs. The controllers used with such AC to DC converters may be electronic devices that use digital and analog circuits and embedded software to accomplish control, monitoring, and communications functions.

Mechanically, the system may use standard and custom parts and materials such as steel, aluminum, plastics, and rubber to provide mounting, service access, cooling and environmental protection for the system components.

The ability to change, combine, and eliminate functions is a hallmark of various embodiments of a DC power system described herein. The present systems may be configured to specific OEM requirements, or the like, including obtaining UL/CSA and CE safety agency listings, certification to the latest IBC seismic standards and/or the like.

As noted, various DC power systems are commercially available that perform similar functions to the functions performed by the present cabinet-based DC power system. However, in most cases, one or more specifications, measures, or parameters of such existing systems falls short of the desired performance characteristics and attributes of the present cabinet-based DC power system.

Figure 1:
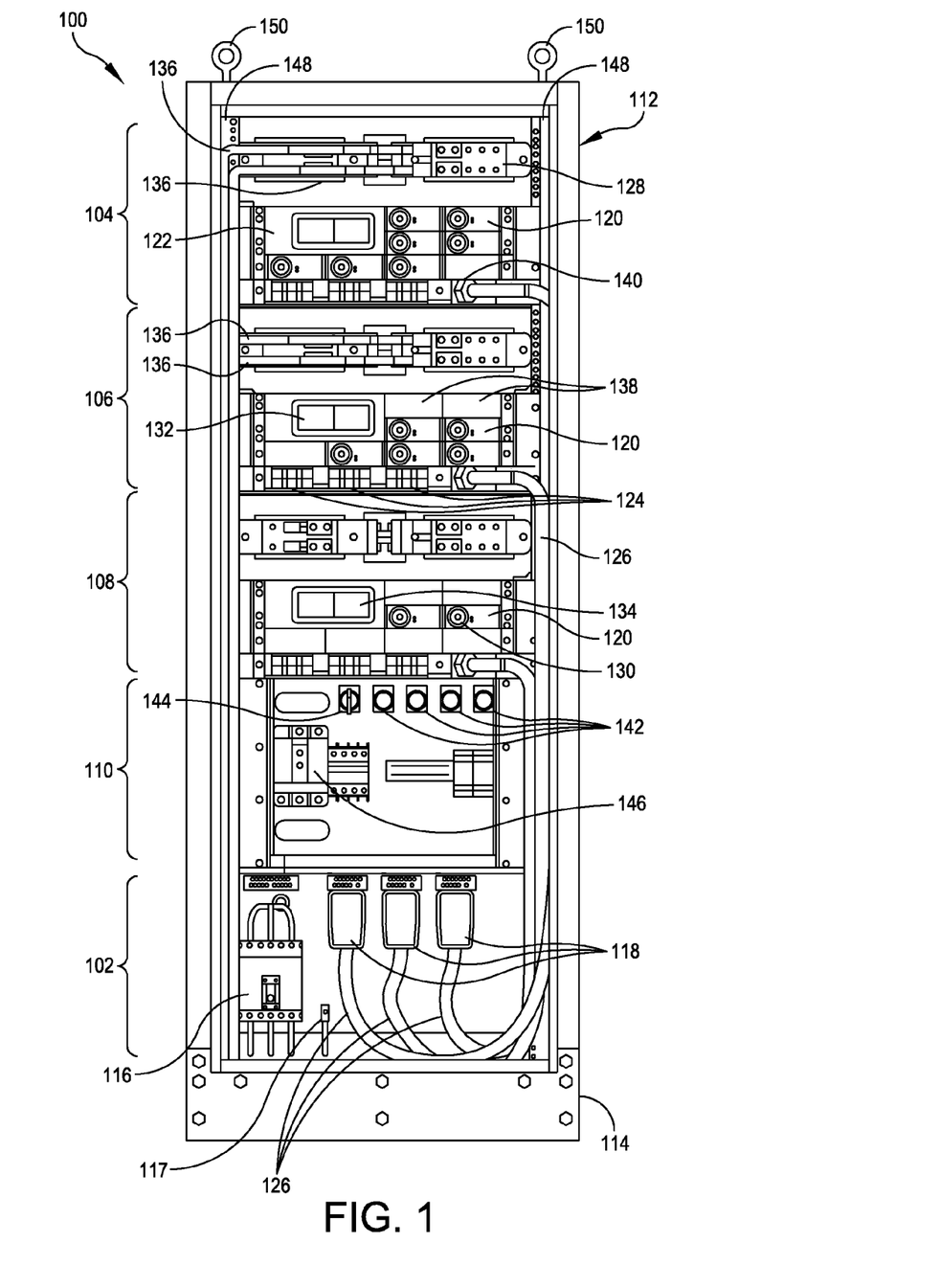
FIG. 1 illustrates a front view of an exemplary cabinet-based DC power system, according to one embodiment.
Figure 2:
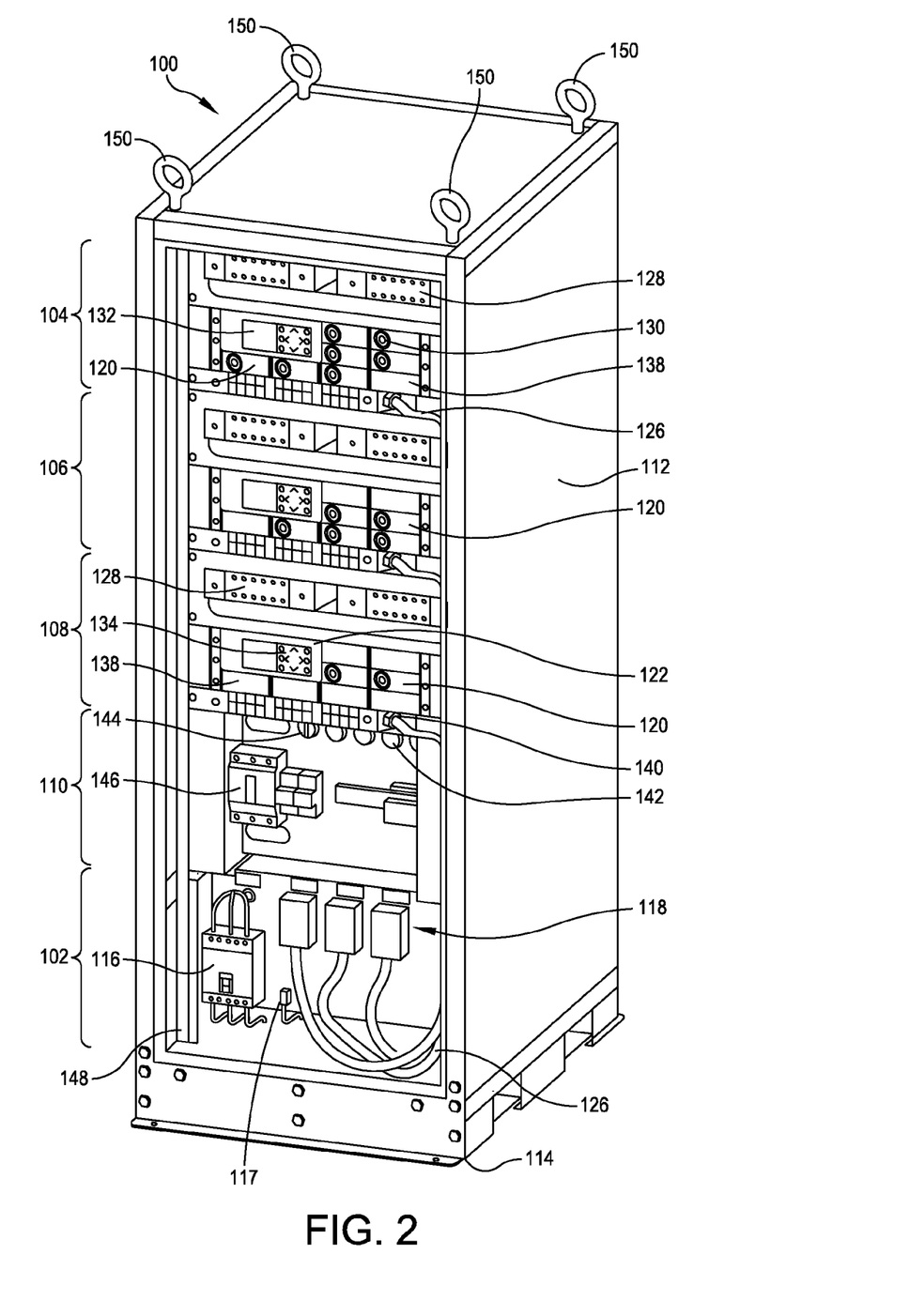
FIG. 2 is a perspective view of the cabinet-based DC power system of FIG. 1, according to one embodiment.
Figure 3:
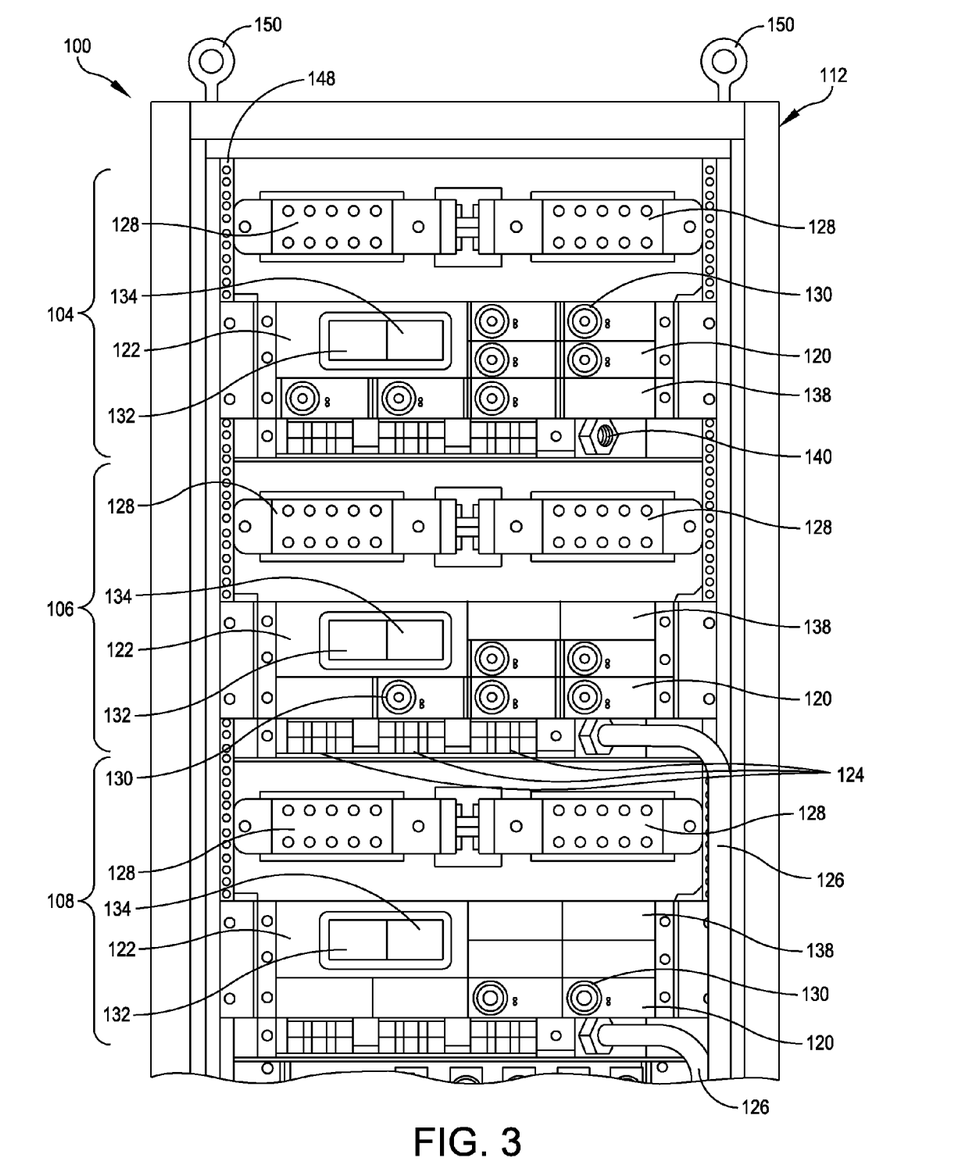
FIG. 3 is an enlarged view of the upper portion of the cabinet-based DC power system of FIG. 1, according to one embodiment.
Figure 4A:
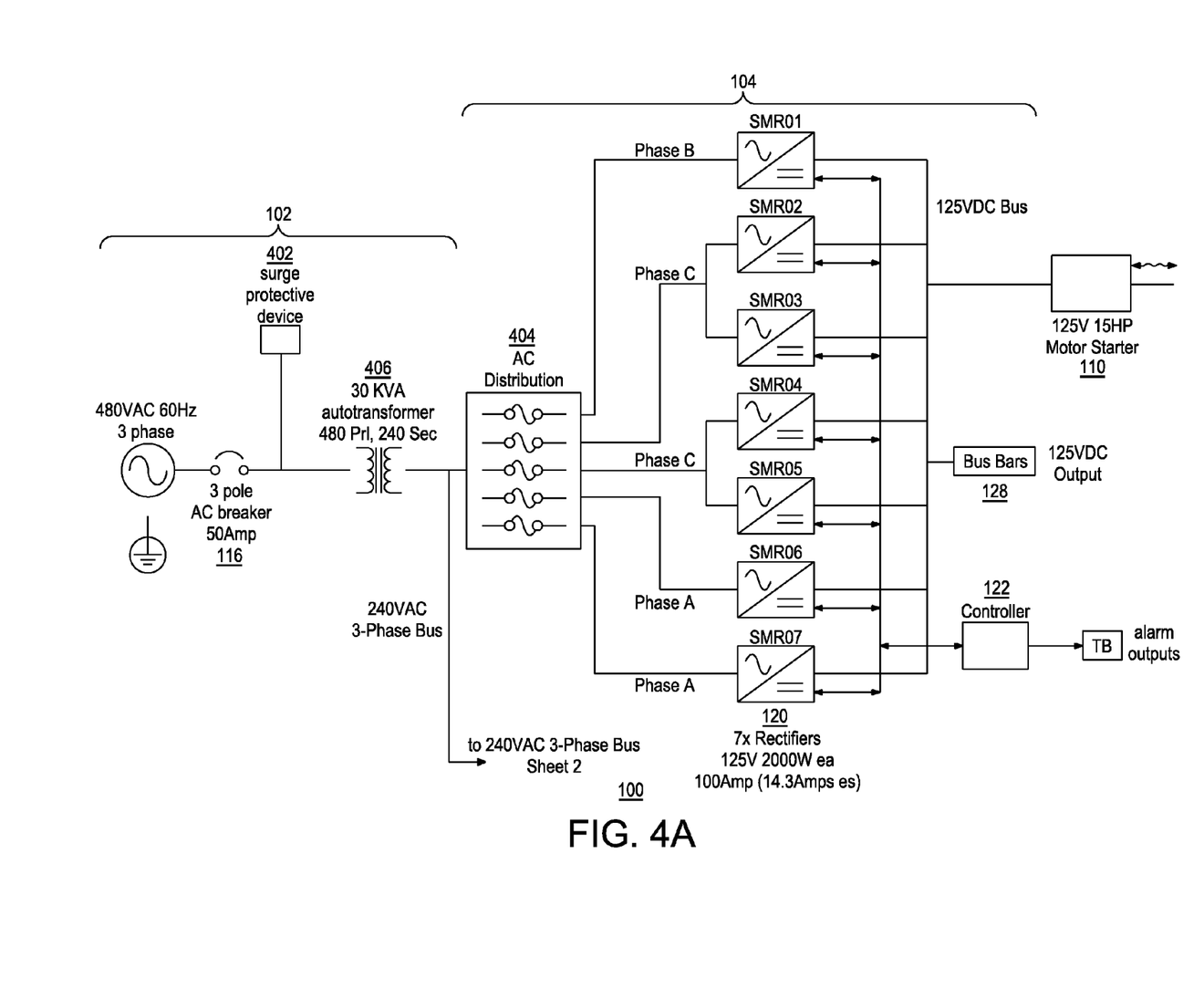
FIGS. 4A and 4B illustrate an exemplary embodiment of a "one-line" wiring schematic diagram of a cabinet-based DC power system, according to one embodiment.
Figure 4B:
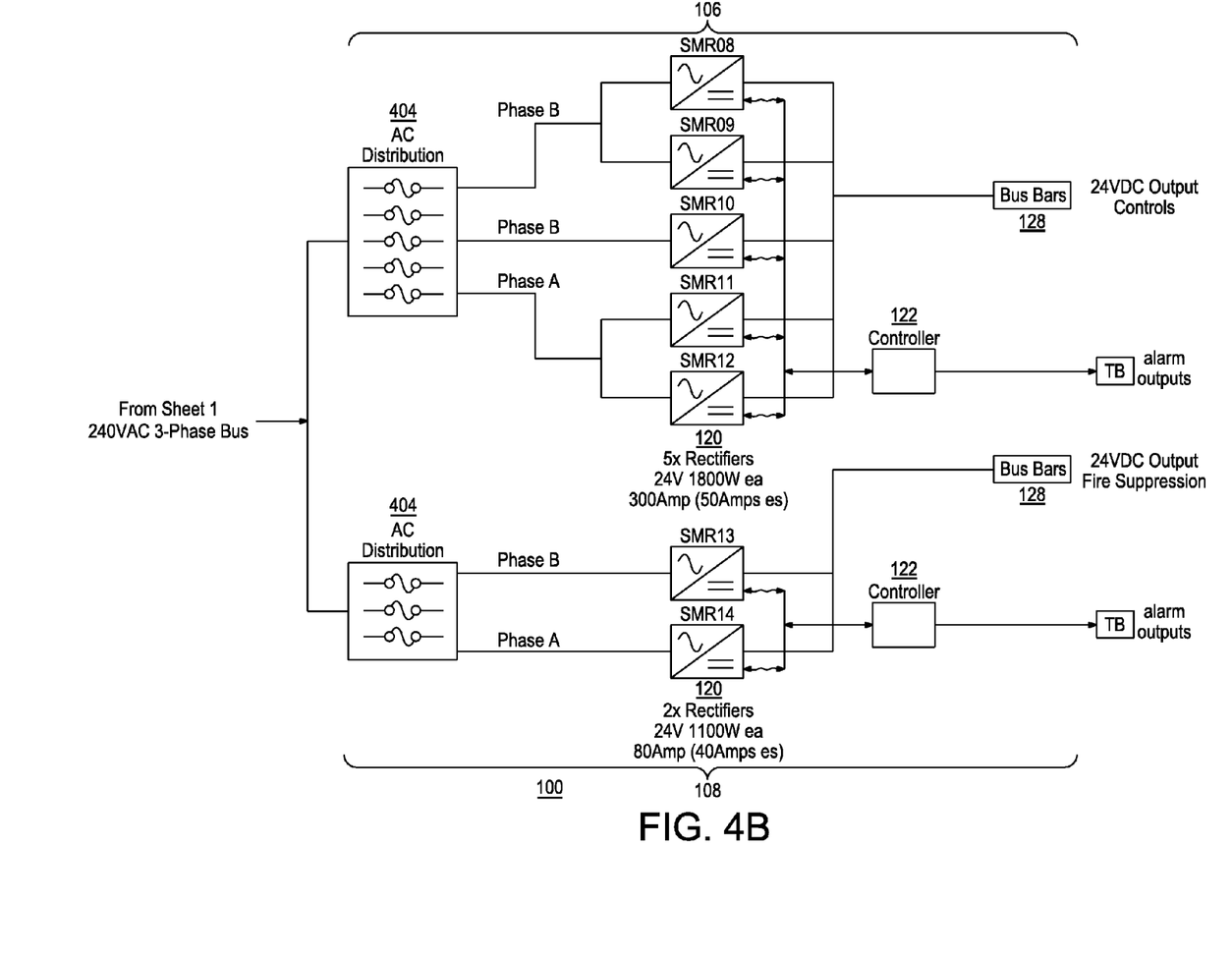
Figure 5A:
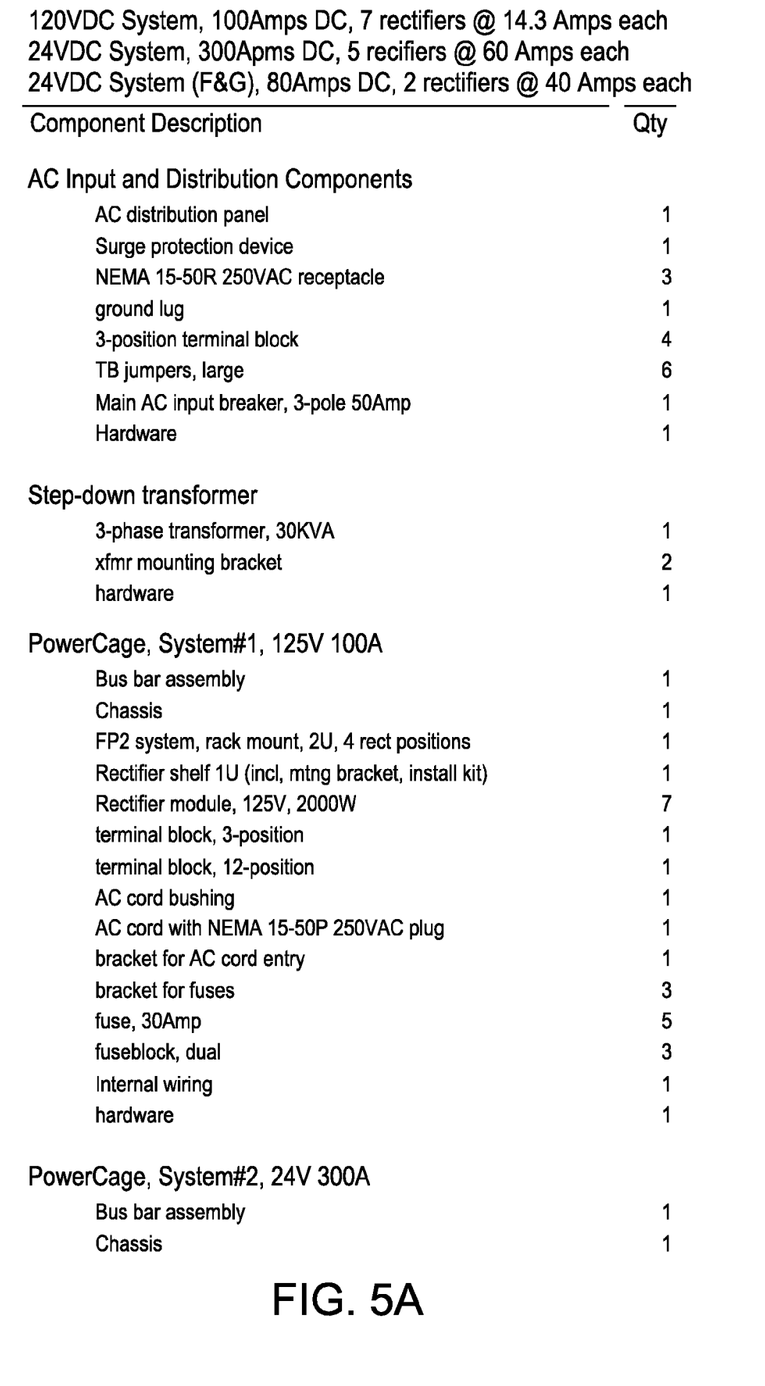
FIGS. 5A and 5B are a summary list of materials for an exemplary cabinet-based DC power system, according to one embodiment.
Figure 5B:
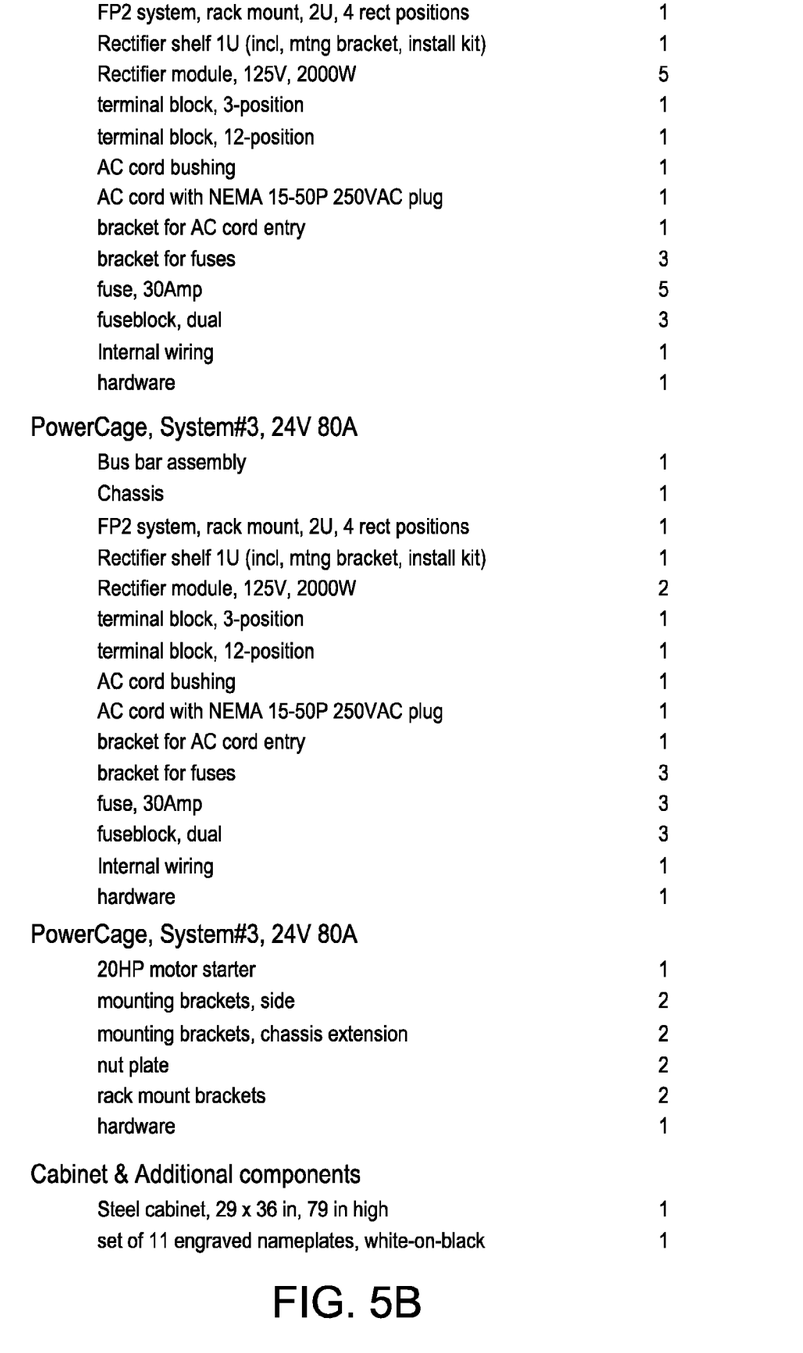

Electrical equipment cabinet systems may be described by various types of engineering documentation including mechanical drawings, diagrams and renderings, bills of material, schematics, wiring diagrams and the like. In accordance with particular embodiments of the present cabinet-based DC power systems, FIG. 1 illustrates a front view of exemplary cabinet-based DC power system 100, according to one embodiment, while FIG. 2 is a perspective view of cabinet-based DC power system 100 of FIG. 1, and FIG. 3 is an enlarged view of the upper portion of the cabinet-based DC power system 100. DC output power cables shown in FIG. 1 are not included in FIGS. 2 and 3. Concurrently, FIGS. 4A and 4B illustrate an exemplary embodiment of a "one-line" wiring schematic diagram of a cabinet-based DC power system 100, according to one embodiment, and FIGS. 5A and 5B are a summary list of materials for an exemplary cabinet-based DC power system 100, according to one embodiment. With initial reference to FIG. 1, and corresponding reference to FIGS. 2, 3, 4A, 4B, 5A and 5B, cabinet-based DC power system 100 may include, but is not limited to, and does not require, one or more of each section or subsystem described below, such as illustrated AC input section 102, illustrated power cages 104, 106, 108 and/or motor starter 110.

Cabinet-based DC power system 100 is, in accordance with various embodiments, highly configurable. As a highly configurable product platform, cabinet systems 100 may draw from a set of many components to meet the requirements of different users. The elements that may be different among cabinet systems include, but are not limited to, features including: power cage DC voltages; the number of power cages; single phase or three phase AC input power; AC input voltage and frequency; and optional equipment such as motor starters (motor starters may vary in size and horsepower rating), transfer switches (multiple types), and inverters (multiple types). Hence, cabinet-based DC power system 100 may include, but is not limited to, and does not require, one or more of each system components described below.

The present system is intended to capable of being qualified, tested, and marked as compliant with IBC seismic standards, OSHPD seismic standards, or other seismic standards. To this end, embodiments of cabinet-based DC power system 100 may be housed in cabinet 112, which may be seismic rated and which may be mounted to seismic rated base 114. Such a seismic rated base 114 and cabinet 112 may be provided to meet IBC seismic compliance standards. Internal components may be selected, adapted, and mounted in various configurations to comply with desired seismic, shock, and vibration standards.

In various embodiments, there may be provided an AC input section 102, which may include: AC input breaker 116; earth ground connections 117; optional surge protection 402 (see FIG. 4A); and AC distribution 404 with front access. AC input section 102, which may include plug and receptacle pairs 118, allows a user to connect their AC power source using user-supplied wiring, to turn the system on and off, to have protection against system damage from lightning strikes and other high-voltage disturbances on the AC line, and to plug and unplug each electrical subsystem in the cabinet.

Illustrated power cages 104, 106 and 108 may provide a mechanical package containing AC to DC converters/rectifiers 120, generally, controllers 122 for converters 120, AC fuses 124, AC cord 126 with plug 118, and a bus bar assembly 128 for DC output. As used herein, the term "rectifier" may refer to a complex AC to DC converter that uses microprocessor control, high frequency switching for power conversion, forced-air cooling with an integral fan 130, and communications by means of a digital interface. Hence, the terms "rectifier" and "converter" may be used interchangeably herein. These devices are also sometimes referred to as a Switched Mode Rectifier (SMR), "power supply", or "battery charger".

In FIGS. 1, 2, 3, 4A, 4B, 5A and 5B three power cages (104, 106 and 108) are illustrated in cabinet-based DC power system 100. Each power cage is its own electrical subsystem and may be referred to as a "battery charger," or the like. A user may plug and unplug AC cord 126 into AC distribution panel 102, install/remove/replace power cages 104, 106 and/or 108 from a front of cabinet 112, read system data and see minor and/or major alarms on lighted displays 132, program the system using the touch-pad 134 on controller 122, attach DC output cables 136 to output bus bars 128, and connect alarm wiring (if any) to terminal blocks located behind the controller touch-pad display. Because each power cage produces its own DC output voltage, independent of the DC outputs of the other power cages, cabinet-based DC power system 100 is a single integrated system that may produce multiple different DC voltages, which for example, may include, but are not limited to, 24V, 48V, 125V, and 220V DC. As but one example, illustrated power cage 104 may provide 125 VDC output, such as may be used by motor starter 110, while power cages 106 and 108 provide 24 VDC output, such as via cables 136.

Power cage 104, 106 or 108 is a rack-mounted subsystem that functions as a DC power supply and/or a battery charger. Such power cages are a self-contained unit but not a fully-enclosed (stand alone) "box" as other battery chargers. Power cage 104, 106 or 108 uses one or more "power shelves" that provide "slots" for switched mode converters. The power shelf (or shelves) is populated with one or more converters 120. The converters are controlled by one or more digital system controllers 122. The power cage 104, 106, 108 has a provision for accepting AC input power which may typically be by means of an AC cord (126) or connector. The power cage 104, 106, 108 has a provision for delivering DC output power available to the user by connection of user-supplied DC wires or cables 136 (which may be referred to as "field wiring"). Power cage 104, 106 or 108 may typically have either bus bars 128 or terminal blocks as the connection point for the DC field wiring. Each illustrated bus bar 128 in the cabinet-based DC power system has two rows of five thru-holes arranged to allow for the connection of one or more industry-standard one-hole and/or two-hole lugs. The bus bar design is L-shaped to allow for a recessed "tail" for factory wiring so the factory lugs are inaccessible to field technicians. Also, the bus bar bracket 128 may form a top cover of power cage 104, 106 or 108.

The present systems are field upgradable to increase DC power output. For example, power cage 104, 106 or 108 may have a number of "slots" that accept converters 120, generally, one converter per slot. If a user system has "empty slots" 138, then it may be possible to add additional rectifiers at a later date to increase DC power. For example, a user system may contain an 8-slot power cage populated with six converters rated at 2 KW each, for a total of 12 KW DC output power. Later, the user may add two more 2 KW converters to fully populate the power cage. Therefore, the system may be upgraded in the field from 12 KW to 16 KW output power. Also, in accordance with various embodiments, if a converter (120) fails it can be replaced quickly without requiring interruption of the rest of the system. This feature may be referred to as a hot swap.

Each power cage 104, 106 and 108 has a hard-wired AC line cord 126 extending to AC cord entry 140 terminated in a plug, which may provide front-accessible AC plug/receptacle pairs 118. AC line cords 126 are routed along an interior wall of the cabinet and the plug is mated to an AC receptacle in AC distribution section 102, in the bottom portion of the cabinet, as illustrated. If desired by a user, various other embodiments might have bare-wire ends for AC wiring 126, which could be connected to terminal blocks, instead of using AC plug/receptacle pairs 118.

Motor starter 110 may be installed in system 100, as illustrated such as to use system 100 as a turbine control power system, or the like. Motor starter 110 may be powered by illustrated 125 VDC power cage subsystem 104 and may be used to limit electric power that is delivered to a user-supplied motor during the first few seconds after it is powered on. This allows the user motor to "soft start," which involves developing some rotational speed and torque before full electric power is applied. Motor starter 110 may have front-face mounted components that allow a user to see the operating status, perform a manual start, and turn the motor starter on and off. Illustrated motor starter 110 has front-face mounted components that allow a user to see the operating status via display lights 142, perform a manual start, and turn the motor starter on and off, such as using manual start/stop switch 144 and/or circuit breakers 146 protecting motor starter 110.

Cabinet-based DC power system embodiments that provide a motor starter, such as illustrated system 100, may be smaller than previous third-party implementations, which were stand alone, sole purpose cabinet-based motor starter systems. To wit, the present system employs a subassembly that is a rack-mount replaceable "box," versus such stand alone, sole purpose cabinet-based motor starter systems.

Figure 6:
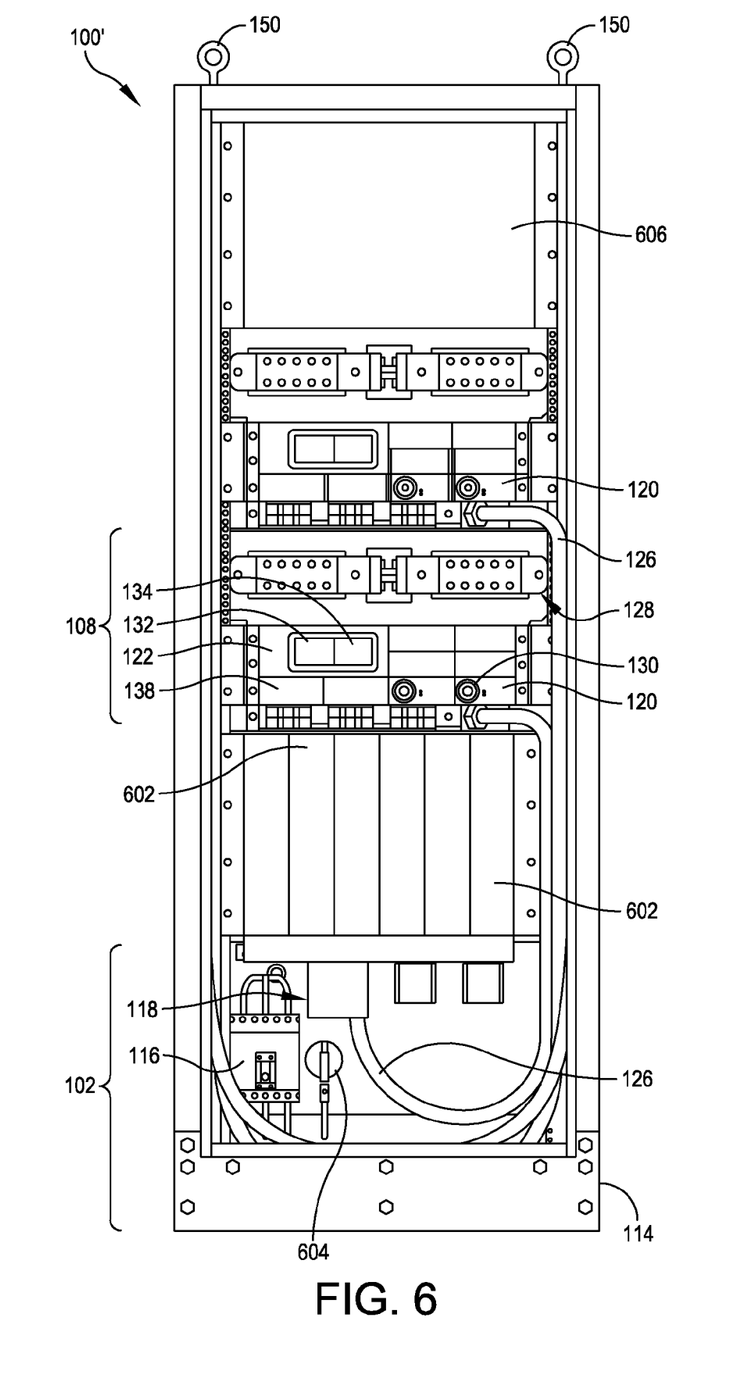
FIG. 6 illustrates another exemplary cabinet-based DC power system, according to one embodiment.

FIG. 6 illustrates another exemplary cabinet-based DC power system 100', according to one embodiment. Therein, different optional equipment is shown mounted, which may include batteries 602, which may be racked in cabinet 112, or in accordance with other embodiments racked in a single cabinet or multi-cabinet systems different from cabinet-based DC power system 100'. The batteries may be installed on racks in such cabinet(s). The batteries used are typically lead acid type and may be of a type referred to as "sealed" or "VRLA" (Valve Regulated Lead Acid), or of a type referred to as "flooded" or "wet". There may also be Nickel-Cadmium (NiCad) wet batteries. The system may contain various devices for filling the batteries with water and electrolyte, spill containment, and other maintenance and safety concerns relating to rechargeable storage batteries for stationary applications. In various embodiments, NiCad batteries, or the like, may be installed empty into the cabinet, secured by hardware and/or straps, and shipped inside the cabinet system to the user. The user may fill the batteries with water, electrolyte, catalyst, or the like, at the installation site. Many terms are used to refer to batteries, and there are several different kinds of batteries that may be used in the types of systems described herein. The majority of systems will use lead-acid batteries, which may be called "batteries", "rechargeable batteries", "stationary batteries", "storage batteries", "front-terminal batteries", "UPS batteries", or other variants. It should be noted that the term "battery" may be used to describe various combinations of series-connected and parallel-connected battery cells. Therefore, a set of batteries connected together but considered as a single battery for purposes of functionality in the system may be referred to as a "battery", or "battery stack", or "battery set" or other variants. The physical enclosure that is used to house one or more battery cells may be referred to as a "battery jar". Other battery types that may be accommodated in system 100' may include NiMH, Lithium-ion, zinc-air, or the like.

Storage batteries are inherently temperature-dependent devices. In accordance with various embodiments, converters 120 may automatically sense temperature, locally and/or remotely, and incrementally decrease battery-charging voltage at higher operating temperatures and incrementally increase battery-charging voltage at lower operating temperatures.

The primary mode of operation of converter 120 is to accept a sinusoidal AC voltage waveform (typically 50 Hz or 60 Hz nominal) and to produce filtered and regulated "clean" DC output power. However, in accordance with various embodiments, converters 120 may also be powered by a DC input voltage. This feature may be referred to as a DC-DC converter. Operating as a DC-DC converter allows for DC power system architectures in which the output of one set of converters, for example 125 VDC output, such as may be supplied by the converters of power cage 104, discussed above, may be used as an input to another set of converters, such as 24 VDC output converters of power cage(s) 106 and/or 108, also discussed above. This can have advantages with regard to battery requirements and allow portions of the system to remain powered by system batteries 602 when AC power is lost.

Optional equipment may further include a manual transfer switch 604. This is, by way of example an AC switch that is manually actuated to operate system 100/100' from one of two separate AC power sources connected to system 100/100'.

Optional equipment may additionally, or alternatively, include inverter 606, an electronic device that converts DC electric power into AC electric power. Such an inverter may be rack-mounted or located elsewhere in the cabinet, such as bolted to an interior cabinet wall. Inverter 606 may be useful for a user who wishes to have continuous uninterrupted AC power derived from battery 602 that is immune to loss of AC power provided by the grid.

Cabinet-based DC power system 100/100' may include various types of controllers. The term "controller" is very general and can mean different things. In the context of the present cabinet-based DC power systems, a controller is a system component which is an electronic device housed in an enclosure which has connections for inputs and outputs, and may have a display. The purpose of a controller is to communicate both within the system among multiple converters 120, and to a device(s) outside of the cabinet system. There are different types of controllers that may be used in cabinet-based DC power system 100, in addition to converter controllers 122 discussed above. For example, a "master" controller which accomplishes primary control of the system and has a display so the user can view system data and a touch-pad user interface so a user can enter commands to change the behavior of the system. There is also a "basic" controller which can communicate with converters 120 and other controllers in the system, which has inputs and outputs and no display and no touch-pad. There is also an "I/O" (input/output) controller which has limited functionality, no display, no touch-pad, but may also be "placed on the bus" to communicate with other controllers in the system and provide additional inputs and outputs.

Cabinet-based DC power system 100/100' may also include various switches and overcurrent protection devices. The term "circuit breaker" (or just "breaker") is very widely used and generally well understood. What is not so well understood is the combined function that a circuit breaker provides which is both switching (a user can use a lever to turn-on or "close" a breaker and turn-on or "open" a breaker) and overcurrent protection (or overload protection). These functions may be separated and implemented in different ways with different types of devices. A fuse is another type of overcurrent protection device, but unless it is combined with something else (like a pullout switch), it is generally not considered a switch. Therefore, herein the terms "circuit breaker", "breaker", "switch", "pullout switch", "fuse", "disconnect", "fused disconnect", "fusible disconnect" and other variants are used as needed.

Thus, in at least one embodiment, of cabinet-based DC power system 100' the AC to DC converters 120 of power cage 108 charges (or recharges) batteries 602 and provide DC power to the user's equipment (loads), which may include, but is not limited to, a turbine power generating system using a power generation turbine. Controllers 122 display system data (132), accept user inputs via digital interface or touch-pad 134, and communicate with converters 120. Batteries 602 are charged (i.e., accept electric power from system converter (s) 108) when AC input power is present and converters 120 may supply DC output power when DC demand is low, while batteries 602 are discharged (i.e., provide electric power to user-supplied equipment or "loads") when output power (load) demand exceeds the DC power being supplied by converters 120. If present in the system, Surge Protective Device (SPD) 402 protects the electrical equipment in the event of transient high voltage, high current events, or both, present on the AC supply that provides input power to system 100'. Circuit breakers 146 may be turned on and off, and provide overcurrent protection. Fuses 124 (if present in system 100') may provide overcurrent protection and may be replaceable by service technicians. Optional equipment (motor starters, inverters, etc.) provide specialized functions for the user's system.

In various embodiments, this DC power system may be used with respect to "turbine control," as described above. As will be appreciated, in other embodiments, it is not necessary to restrict the characterization and usage of this DC power system to "turbine control". In general, the present DC power system may be used to provide single or multiple DC electric power outputs to a wide variety of electrical, electronic components, equipment. The cabinet system may contain: electrical and electronic equipment and components only; rechargeable batteries only; both electrical and electronic equipment and components and rechargeable batteries; and/or be otherwise configured.

Other available components or equipment may be installed in various embodiments of the present cabinet-based DC power systems 100/100', including, but not limited to: circuit breakers (such as circuit breaker 146 for motor starter 110), vertical rack mount rails 148 such as those that may meet EIA standards, relays, voltage monitoring equipment, current shunts, general purpose processor-based computer devices, application specific integrated circuit-based devices, other communications and monitoring equipment, and/or the like. Other parts may include hinged doors, removable panels (full or partial) located on any side or bottom or top, cooling vents, filters, fans, thermometers, and/or the like, mounted on or in these steel cabinet systems.

Because DC power systems 100/100' described herein are highly configurable, "stripped down" cabinet systems, or even an empty cabinet might be provided if a user previously purchased one of the present power systems, and wished to replicate the appearance, size and ruggedness of the cabinet, such as to place a matching cabinet next to the purchased power system at the user's site. Such a cabinet could be populated with various types of equipment. In accordance with various method embodiments a user can be supplied any of a full range of cabinet systems from a minimum stripped-down model, to a fully-loaded model. This could be applied to all three fundamental types of systems: electronics only, batteries only, and/or electronics and batteries.

In accordance with embodiments of the present cabinet-based DC power system, previously separate systems are now integrated into an electrical equipment cabinet that makes better use of a volume of space so as to provide a greater level of integration. Various embodiments provide a smaller "footprint" (width and depth dimensions that consume floor space) and better usage of height (for example, from floor level to approximately 7 feet above the floor).

Each subsystem, and/or subsystem component, may be accessible from the front of cabinet 112 for removal and replacement, whether for reasons of repair or upgrade, thereby minimizing the time and disruption in case service or replacement of any system assemblies becomes necessary. This feature may be referred to as "front access" and may facilitate installation of a cabinet system at a user site in a location where access to the back or sides of the cabinet due to the presence of walls and/or other equipment is impeded. State of the art systems generally require removal of the cabinet from the installed location and replacement of the entire cabinet when certain components mounted in the cabinet fail. This creates significant issues for the user. With the "front access" design of the system, the cabinet is designed to allow removal and replacement of subsystem components so as to enhance the usefulness of the cabinet by minimizing replacement time for components and allowing upgrades without replacement of the entire cabinet. In various embodiments, all of the components may be removed and replaced from the front of the cabinet.

"Top lift" may be useful in various embodiments of the present cabinet-based DC power systems as it might not be possible to install a cabinet system by moving it with forklift equipment, or the like, through doors, across floors and such, in a particular installation. In accordance with such embodiments, the cabinet system can be lifted, moved, and placed using an appropriate machine that has chains, belts, or other mechanical lifting devices attached to ring bolts 150 or other hardware on the top of the cabinet and/or elsewhere on the cabinet.

In accordance with various embodiments, the cabinet is mechanically rugged, in that the system has significant mass and needs to withstand high forces during shipping, which may be by truck, train, ship, or aircraft, and installation and/or service may result in "man-handling" of cabinet system. Further, users may require performance and safety of the system during and after an earthquake, or similar incidence.

In accordance with various embodiments of the present systems, a number of preexisting features and functions may be utilized from components from third parties and installed in the present cabinet system. Of particular interest is equipment from Eltek (Eltek Inc., Eltek ASA or Eltek AS) of Norway, such as switched mode AC to DC converters/rectifiers, controllers (electronic devices that monitor and control the converters), and/or "rectifier shelves" or "power shelves" that house such converters and/or controllers.

Modularity and interchangeability may be provided in several different functional areas of system 100/100'. For example, with respect to an AC power source or AC power sources, a user may choose a system with or without a step-down transformer 406 installed in the cabinet to accommodate 3-wire 480 VAC (or 400 VAC) 3-phase or single phase input power. The step-down transformer 406 may, for example, accept 480 VAC on the primary side, and produce 240 VAC on the secondary side. In this way, the user is able to use their preferred AC source voltage of 480 VAC, and at the same time the rectifiers 120 are powered by 240 VAC, which may be a preferred voltage for rectifiers 120. In such an example the AC input voltage specification of rectifiers 120 may be 300 VAC maximum (277 VAC nominal) so it may not be possible to power rectifiers 120 directly from 480 VAC.

For systems that are running at high power levels, cooling may be a technical design challenge. For most systems, convection cooling at the cabinet level may be sufficient, particularly give that converters 120 may each have an integral fan that provides forced-air cooling, in the direction of front to back in the converter. The reasons that system convection cooling is desired include lower cost, because no cabinet fan(s) is/are needed, no accompanying materials such as wires and mounting hardware are needed for the fan(s), and increased reliability, because there are no fans to break.

However, if the requirements of a system, such as total power, maximum ambient operating temperature, etc., cannot be met using convection cooling at the cabinet level, it may be necessary to implement forced-air cooling using one or more fans and other devices such as baffles, plenums, channels, filters, refrigeration units and other features to produce the necessary cooling for the system.

Another consideration with respect to electrical and electronic equipment is the usage of high-quality components. A unique part number may be assigned to each component in a product and an Approved Manufacturers List (AML) for each part may be maintained. In electrical systems, high temperatures are often important in terms of selection of materials. Wherever applicable, materials should be used that do not degrade or become dangerous when they get hot or are exposed to flame. To prevent electrical shocks from touch, appropriate insulating materials are deployed as necessary with respect to system components. As noted, the present systems may comply with UL safety standards, namely, the UL Standard for Safety, "UL 1778, Uninterruptible Power Systems".

A further example of modularity and interchangeability may include, with respect to DC output connections, a system with or without standard bus bars, and/or with a particular type of terminal block. At least one embodiment of system 100/100' may have a terminal block, and/or other components, specific for a particular user for that user. In this way, a highly configurable set of cabinet-based DC power systems may be offered to a user base. In addition to the choice of physical connections such as bus bars and terminal blocks, a user may also choose a cabinet system with one or more DC circuit breakers of various ampere ratings. Furthermore, a "DC distribution panel" may be used to allow for shipment of the cabinet system with a defined set of DC distribution breakers, and/or empty breaker slots to allow the user to install additional circuit breakers in the future as needed In order to conserve "U height" (vertical height units, one "U" is defined as 1.75 inches) in the cabinet rack, a DC distribution breaker panel can be oriented horizontally instead of the more traditional vertical orientation. In addition, users may choose other types of devices in lieu of circuit breakers. One such example is a "pullout switch" which is a housing for fuses. A pullout switch has a fixed part and a removable part that fit together. The removable part is pulled out using a handle, and a technician can install or replace a fuse(s) and replace the removable part again.

As noted, a user may choose to include a motor starter, an inverter, a manual transfer switch, a load disconnect device, or other types of equipment that are needed in their system. Thusly, by integrating system-level equipment and components into a single cabinet or multiple cabinet system, the user may be provided a solution that reduces time needed to complete a system installation and reduces risk of installation errors. Further, the floor area required for a system can be reduced by this type of system integration. Multiple systems in one cabinet consume less than 50% of the space of older products. Multiple systems support multiple DC voltages in one cabinet, which for example, in accordance with various embodiments, may include, but are not limited to, 24V, 48V, 125V, and 220V DC. Multiple systems include related subassemblies, such as reduced voltage motor starters, inverters, DC-DC converters. 94% efficient chargers, which may be used in the present systems act to cut waste heat in half, enabling less costly air conditioning units. The multiple subsystems in one cabinet ships fully assembled so as to offer higher quality, decreased on-site labor time, cost and risk. The multiple subsystems in a cabinet allow hot swap power modules so as to enable "N+1" redundancy. The multiple subsystems in a cabinet may be fully modular, with all front access construction so as to enable fastest possible field service.

In at least one embodiment, manufacturing steps may include buying or building one or more cabinets. In exemplary embodiments, the one or more cabinets may be fabricated with steel material. In other embodiments, the one or more cabinets may be fabricated with one or more other materials. Possibly following a pre-defined order of assembly, and, for each piece of equipment and component in the system, placing the component in the cabinet. Thus, in accordance with various embodiments a compact cabinet-based DC power system may be assembled by providing one or more steel cabinets 112, into which AC input section 102 is disposed. At least one AC to DC converter 120 is disposed in cabinet 112 as at least one interchangeable module and AC power from AC input section 102 is supplied to converter(s) 120. At least one other electrical component is disposed in the cabinet. This component may be selected from the group that includes reduced voltage motor starter 110, a DC-to-DC converter, a DC to AC inverter 606, one or more batteries 602, or the like. DC power is supplied from converter(s) 120 to the electrical component(s).

There are several advantages to the present highly integrated DC power systems. These advantages include, but are not limited to, standard configurations that can be pre-certified with various regulatory agencies, saving lead time, logistics hassles and expense compared to forcing the user to certify case-by-case and/or on-site. Another advantage is that completed systems can be delivered fully tested and ready to use, versus lengthy install/test/debug cycles on-site. This is significant because of complex electrical, mechanical, thermal, and software/firmware interactions. Another advantage is that user ordering is greatly simplified. The user can order one system part number versus hundreds of component part numbers. Another advantage is that pre-engineered wiring interconnect systems have shorter runs and fewer points of failure. One other advantage is that fully engineered solutions for all electrical and mechanical joints ensures that variation due to subjective decisions by individual tradesmen during installation are eliminated.

In at least one embodiment, installation and operation steps may be undertaken as follows. After transporting the cabinet system to the vicinity of the installation site, unpack the system and move it by fork-lift, pallet jack, crane, or other appropriate load handling equipment to the location at or near where it is to be installed. Install and prepare any necessary materials or accessories for each piece of equipment and component in the system. It may be necessary to load converters into empty slots in one or more power cages. The user may choose to add or remove components, such as labeling, cooling apparatus, switches, circuit breakers, inverters, surge protectors, and other items either in, on, or around the cabinet system.

Although the above embodiments have been described in language that is specific to certain structures, elements, compositions, and methodological steps, it is to be understood that the technology defined in the appended claims is not necessarily limited to the specific structures, elements, compositions and/or steps described. Rather, the specific aspects and steps are described as forms of implementing the claimed technology. Since many embodiments of the technology can be practiced without departing from the spirit and scope of the invention, the invention resides in the claims hereinafter appended.

What is claimed is:

1. A compact factory assembled and tested cabinet-based direct current power system, comprising:

a plurality of alternating to direct current converters disposed in a cabinet as at least one interchangeable module;

an alternating current input section, disposed in the cabinet and supplying alternating current to the plurality of converters;

at least one electrical component disposed in the cabinet and receiving direct current from at least one of the converters;

wherein the cabinet is configured to allow modular replacement of each one of the at least one electrical components from only the front thereof; and wherein the cabinet-based direct current power system is significantly smaller than multiple power systems, a separate motor starter and related wiring.

2. The cabinet-based direct current power system of claim 1, wherein the at least one electrical component is disposed in the cabinet as an interchangeable module.

3. The cabinet-based direct current power system of claim 1, wherein the direct current converters and the at least one electrical component are accessible from a front of the cabinet for removal and replacement, wherein the cabinet is configured to allow modular replacement of the at least one electrical components from only the front thereof.

4. The cabinet-based direct current power system of claim 1, further comprising wiring disposed in the cabinet configured to operatively connect at least one of the plurality of converters to the at least one electrical component.

5. The cabinet-based direct current power system of claim 1, wherein the at least one electrical component is a motor starter disposed in the cabinet.

6. The cabinet-based direct current power system of claim 1, wherein the at least one electrical component is a motor starter disposed in the cabinet and at least one of the converters converts alternating current voltage to 125 volts direct current supplied to the motor starter.

7. The cabinet-based direct current power system of claim 1, wherein the at least one electrical component is at least one battery disposed in the cabinet, the at least one converter charging the at least one battery.

8. The cabinet-based direct current power system of claim 1, wherein at least one of the at least one electrical component is at least one battery disposed in the cabinet charged by the at least one converters and at least one other component is a direct current to alternating current inverter disposed in the cabinet receiving direct current from the at least one battery and providing alternating current.

9. The cabinet-based direct current power system of claim 1, wherein the cabinet-based direct current power system is at least a portion of a turbine control system.

10. The cabinet-based direct current power system of claim 1, wherein the at least one electrical component is at least one direct current-to-direct current converter disposed in the cabinet.

11. A compact factory assembled and tested cabinet-based turbine control power system, comprising:

at least one alternating to direct current converter disposed in a cabinet as at least one front access, interchangeable module;

an alternating current input section, disposed in the cabinet and supplying alternating current to the at least one converter; and a reduced voltage motor starter, disposed in the cabinet as a front access, interchangeable module and receiving direct current from the at least one converter;

further comprising wiring disposed in the cabinet configured to operatively connect the at least one converter to the reduced voltage motor starter; and wherein the cabinet-based direct current power system is significantly smaller than multiple power systems, a separate motor starter and related wiring.

12. The cabinet-based turbine control power system of claim 11, wherein the at least one converter converts alternating current voltage to 125 volts direct current supplied to the motor starter.

13. The cabinet-based turbine control power system of claim 11, further comprising at least one additional electrical component disposed in the cabinet and receiving direct current from at least one additional converter disposed in the cabinet.

14. The cabinet-based turbine control power system of claim 13, wherein the at least one electrical component is at least one battery disposed in the cabinet, the at least one additional converter charging the at least one battery.

15. The cabinet-based turbine control power system of claim 13, wherein at least one of the at least one additional electrical components is at least one battery disposed in the cabinet charged by the at least one additional converter and at least one other additional component is a direct current to alternating current inverter disposed in the cabinet receiving direct current from the at least one battery and providing alternating current.

16. The cabinet-based turbine control power system of claim 13, wherein the at least one additional electrical component is disposed in the cabinet as an interchangeable module.

17. A compact factory assembled and tested cabinet-based direct current power system, comprising:

a plurality of alternating to direct current converters disposed in a cabinet as at least one interchangeable module;

an alternating current input section, disposed in the cabinet and supplying alternating current to the plurality of converters;

at least one electrical component disposed in the cabinet and receiving direct current from at least one of the converters;

wherein the at least one electrical component is at least one direct current-to-direct current converter disposed in the cabinet; and wherein the at least one direct current-to-direct current converter converts direct current from one of the plurality of converts for input into another of the converters.

18. A compact factory assembled and tested cabinet-based turbine control power system, comprising:

at least one alternating to direct current converter disposed in a cabinet as at least one front access, interchangeable module;

an alternating current input section, disposed in the cabinet and supplying alternating current to the at least one converter; and a reduced voltage motor starter, disposed in the cabinet as a front access, interchangeable module and receiving direct current from the at least one converter;

at least one additional electrical component disposed in the cabinet and receiving direct current from at least one additional converter disposed in the cabinet; and wherein the at least one electrical component is at least one direct current-to-direct current converter disposed in the cabinet as a module that converts direct current from one of the at least one converter for input into the at least one other converter.

* * * * *